United States Patent
González et al.

(10) Patent No.: US 6,440,825 B1
(45) Date of Patent: *Aug. 27, 2002

(54) METHOD OF CONTROLLING OUTDIFFUSION IN A DOPED THREE-DIMENSIONAL FILM

(75) Inventors: Fernando González; D. Mark Durcan, both of Boise; Luan C. Tran, Meridian; Robert B. Kerr, Boise; David F. Cheffings, Boise; Howard E. Rhodes, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/616,540

(22) Filed: Jul. 14, 2000

Related U.S. Application Data

(63) Continuation of application No. 09/310,489, filed on May 12, 1999, now Pat. No. 6,159,790, which is a continuation of application No. 08/589,277, filed on Jan. 18, 1996, now Pat. No. 5,994,182.

(51) Int. Cl.$^7$ ............................................. H01L 21/70
(52) U.S. Cl. ....................................... 438/525; 438/253
(58) Field of Search ................... 438/253, 396, 438/525, 514, 530, 532, 524, 239, 243

(56) References Cited

U.S. PATENT DOCUMENTS

| | | | |
|---|---|---|---|
| 4,280,854 A | * | 7/1981 | Shibata et al. |
| 4,629,520 A | * | 12/1986 | Ueno et al. |
| 5,037,773 A | * | 8/1991 | Lee et al. |
| 5,130,885 A | * | 7/1992 | Fazan et al. |
| 5,155,369 A | * | 10/1992 | Current |
| 5,176,789 A | * | 1/1993 | Yamazaki et al. |
| 5,177,030 A | * | 1/1993 | Lee et al. |
| 5,198,386 A | * | 3/1993 | Gonzalez |
| 5,346,836 A | * | 9/1994 | Manning et al. |
| 5,348,901 A | * | 9/1994 | Chen et al. |
| 5,393,687 A | * | 2/1995 | Liang |
| 5,413,950 A | * | 5/1995 | Chen et al. |
| 5,578,516 A | * | 11/1996 | Chou |
| 5,597,754 A | * | 1/1997 | Lou et al. |
| 5,599,736 A | * | 2/1997 | Tseng |
| 5,618,747 A | * | 4/1997 | Lou |
| 5,712,181 A | * | 1/1998 | Byun et al. |
| 5,763,306 A | * | 6/1998 | Tsai |
| 5,804,852 A | * | 9/1998 | Yang et al. |

\* cited by examiner

*Primary Examiner*—Savitri Mulpuri
(74) *Attorney, Agent, or Firm*—Thorp Reed & Armstrong, LLP

(57) ABSTRACT

A solid state fabrication technique for controlling the amount of outdiffusion from a three-dimensional film is comprised of the step of providing a first layer of insitu doped film in a manner to define an upper portion and a lower portion. A second layer of undoped film is provided on top of the first layer to similarly define an upper portion and a lower portion. The first and second layers are etched according to a predetermined pattern. The second layer is doped to obtain a desired dopant density which decreases from the upper portion to the lower portion. Outdiffusion of the dopant from the upper portion of the second layer results in the dopant migrating to the lower portion of the second layer. Thus, outdiffusion into the substrate, and the problems caused thereby, are eliminated or greatly reduced.

17 Claims, 4 Drawing Sheets

METHOD OF CONTROLLING OUTDIFFUSION IN A DOPED THREE-DIMENSIONAL FILM

This application is a continuation of U.S. application Ser. No. 09/310,489 filed May 12, 1999, now U.S. Pat. No. 6,159,790 which is a continuation of U.S. application Ser. No. 08/587,277 filed Jan. 18, 1996, now U.S. Pat. No. 5,994,182.

BACKGROUND OF THE INVENTION

1. Field of the Invention

The present invention is directed to solid state fabrication techniques and, more particularly, to techniques used to produce three-dimensional, doped films particularly useful in the construction of solid state memory devices.

2. Description of the Background

Memory cells, such as those of dynamic random access memories (DRAM), are comprised of two main components: a field-effect transistor (FET) and a capacitor. In memory cells utilizing a conventional planar capacitor, far more chip surface area is dedicated to the planar capacitor than to the FET. Wordlines are generally etched from a polysilicon-1 layer. A doped region of silicon substrate functions as the lower (storage-node) capacitor plate while a doped polysilicon-2 layer generally functions as the upper capacitor plate (cell plate). Although planar capacitors have generally proven adequate for use in memory chips up to the one-megabyte level, they are considered to be unusable for more advanced memory generations.

As component density in memory chips has increased, the shrinkage of cell capacitor size has resulted in a number of problems. Firstly, the alpha-particle component of normal background radiation can generate hole-electron pairs in the silicon substrate, which can be collected by the lower capacitor plate. The phenomena will cause a charge stored within the affected cell capacitor to rapidly dissipate, resulting in a "soft" error. Secondly, the sense amplifier differential signal is reduced. That aggravates noise sensitivity and makes it more difficult to design column sense-amplifiers having appropriate signal selectivity. Thirdly, as cell capacitor size is decreased, the smaller charge stored within the cell leaks to an unusable level sooner, which necessitates more frequent interruptions for refresh overhead.

As a result of the problems associated with the use of planar capacitors for high-density memories, manufacturers of, for example, 4-megabyte DRAMs are utilizing cell designs based on non-planar capacitors. Two basic non-planar capacitor designs are currently in use: the trench capacitor and the stacked capacitor. Both types of non-planar capacitors typically require a considerably greater number of masking, deposition, and etching steps for their manufacture than does a planar capacitor.

In a trench capacitor, charge is stored primarily vertically, as opposed to horizontally in a planar capacitor. Because trench capacitors are fabricated in trenches which are etched in the substrate, some trench capacitor structures can be susceptible to soft errors. In addition, there are several other problems inherent in the trench design. One problem is that of trench-to-trench charge leakage caused by the parasitic transistor effect between adjacent trenches. Another problem is cell storage node-to-substrate leakage attributable to single crystal defects which are induced by stress associated with the trench structure. Yet another problem is the difficulty of completely cleaning the trenches during the fabrication process. Failure to completely clean a trench will generally result in a defective cell.

The stacked capacitor design, on the other hand, has proven somewhat more reliable and easier to fabricate than the trench design. However, in the stacked capacitor design, the layer of material which forms the storage node is in contact with the substrate. Subsequent processing steps tend to cause outdiffusion of the dopant which adversely affects the diode junction profile as well as the threshold voltage for the access transistor. Thus, the need exists for a method of controlling the outdiffusion from a doped three-dimensional film.

SUMMARY OF THE INVENTION

The present invention, in its broadest aspect, is directed to a solid state fabrication technique for controlling the amount of outdiffusion from a three-dimensional film. The technique is comprised of the steps of providing a first layer of insitu doped film in a manner to define an upper and a lower portion. A second layer of undoped film is then provided in a manner to similarly define an upper and a lower portion. The first and second layers are etched according to a predetermined pattern. The second layer is doped with an implant to obtain a desired dopant density which decreases from the upper to the lower portion of the second layer. By decreasing the density of the desired dopant at the lower portion of the film, outdiffusion of the dopant into the substrate is greatly reduced. Outdiffusion of the dopant from the upper portion of the second layer results in the dopant migrating to the lower portion of the second layer. Thus, outdiffusion into the substrate, and the problems caused thereby, are eliminated or greatly reduced.

In one application of the present invention, the fabrication technique may be used for controlling the amount of outdiffusion from a stacked, polysilicon storage node. According to that embodiment of the present invention, a first layer of insitu doped polysilicon is provided in a manner to define an upper portion and a lower portion of the first layer. A second layer of undoped polysilicon is provided in a manner to define an upper and a lower portion of the second layer. The first and second layers of polysilicon are etched according to a storage node pattern. The second layer of polysilicon is doped with an angled implant to obtain a desired dopant density which decreases from the upper portion to the lower portion of the second layer. The doping step may be carried out using two different angles of orientation for the implant. The angle of incidence of the implant with the wafer's surface varies from between approximately seven to twenty-five degrees. The lower dopant dosages coupled with improved performance of the capacitor offset the extra fabrication time required by the two-angle implant.

The method of the present invention can be adapted to provide a fabrication technique for constructing a stacked capacitor. The present invention is accordingly directed to a fabrication technique for constructing a stacked capacitor and such a stacked capacitor. The fabrication technique for constructing the stacked capacitor is comprised of the steps of providing a first layer of insitu, lightly doped film. A second layer of undoped film is provided on top of the first layer. The first and second layers are etched according to a storage node pattern. The second layer is doped to achieve a higher level of dopant in the second layer than the level of dopant in the first layer. A level of dielectric material is provided and then etched so as to leave portions of the dielectric layer on top of the second layer. A layer of cell plate material is provided and then etched to form the capacitor's cell plate. By utilizing a two film approach for creating the capacitor's storage node, outdiffusion from the storage node into the substrate is greatly reduced or eliminated. Controlling or eliminating the outdiffusion results in improved characteristics of the diode junction profile, longer periods before static refresh is required, and better results with respect to soft errors. Those, and other advantages and benefits of the present invention, will become apparent from the Description Of The Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

For the present invention to be understood, the present invention will be described in the context of fabricating stacked capacitors for a DRAM cell. The reader should recognize that the present invention is not limited to the fabrication of any particular device. Rather, the techniques of the present invention may be employed in the fabrication of a variety of devices. The following description in conjunction with the fabrication of stacked capacitors for a DRAM cell is for purposes of illustration only and not limitation.

Figure 1:
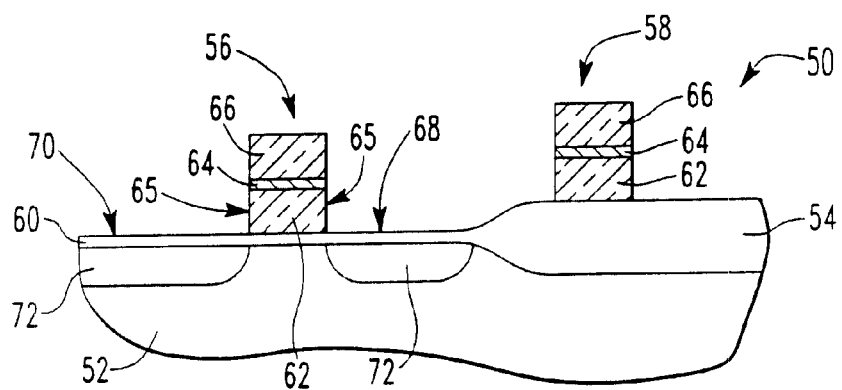
FIGS. 1 through 3 illustrate a series of fabrication steps which show one example of providing an array of electrically insulated word lines on top of a semiconductor wafer while defining upwardly exposed active regions adjacent the word lines for connection with memory cell capacitors.

Turning first to FIG. 1, a semiconductor wafer fragment 50 comprised of a bulk substrate region 52, field oxidation region 54, and a pair of wordlines 56, 58 is illustrated. Wordlines 56 and 58 are comprised of a gate oxide region 60, conductively doped polysilicon region 62, a metal silicide layer 64, and a overlying oxide cap 66. Layers 66, 64, and 62 have been patterned as shown to define wordline outlines 56, 58. Wordlines 56, 58 include opposing edges 65 of polysilicon material. Wordlines 56, 58 are patterned to define a first region 68 for formation of first n-channel active areas for electrical connection with a memory cell capacitor, and to define a second region 70 for formation of second n-channel active areas for electrical connection with bit lines.

A punch-through, p-type, lightly doped halo implant is conducted through gate oxide layer 60 into first and second regions 68, 70, respectively, to define implant region 72 for use in formation of lightly doped source/drain (LDD) regions for the first and second n-channel active areas. An example dopant would be boron implanted at an energy of 50 KeV at a dose of $4 \times 10^{12}$ atoms/cm$^2$.

Figure 2:
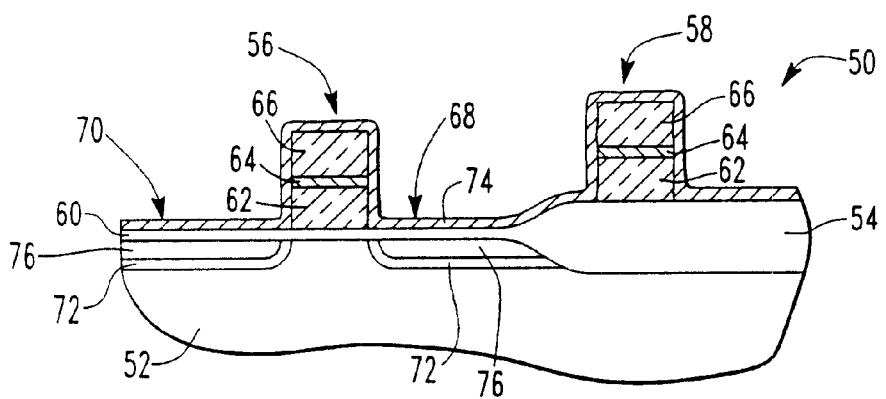

Referring to FIG. 2, wafer 50 is subjected to oxidizing conditions to grow an oxide layer 74 on the upper surface of the wafer 50. After the oxide layer 74 is grown, an n-LDD implant is conducted into first and second regions 68, 70, respectively, to define n-type implant regions 76. An example deposition would be to provide a phosphorus dopant at 100 KeV at a dose of $1.5 \times 10^{13}$ atoms/cm$^2$.

Figure 3:
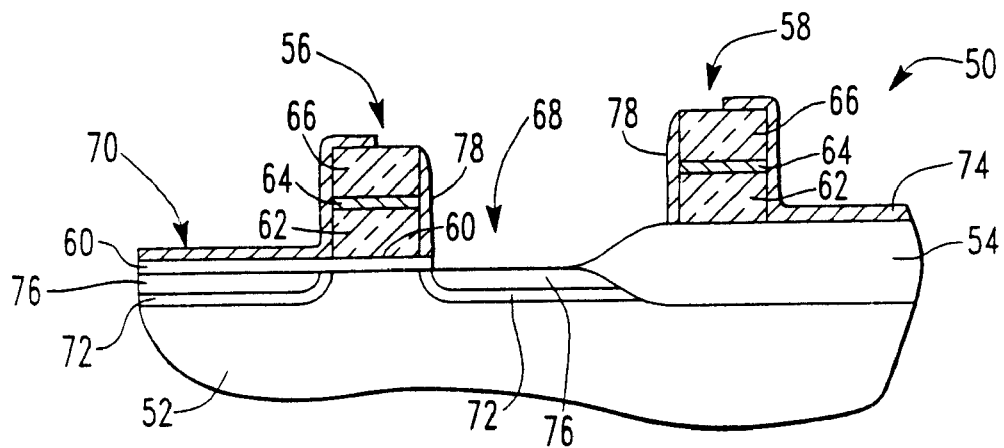

Referring to FIG. 3, the oxide layer 74 is etched to define wordline spacers 78. The typical and preferred etch for producing spacers 78 is a dry reactive ion etch. During such etch or thereafter, any remaining insulating material of exposed layer 60 is etched to upwardly expose first region 68.

The above described process through FIG. 3 is but one example of how to provide an array of electrically insulated wordlines on top of a semiconductor wafer and define upwardly exposed first active regions adjacent the wordlines for connection with memory cell capacitors. Other methods could be utilized.

Figure 4:
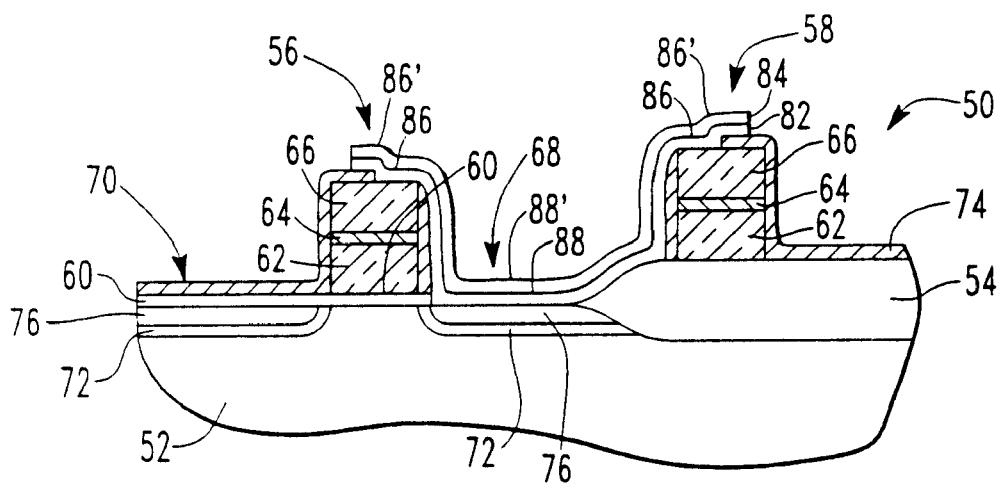
FIG. 4 illustrates the wafer of FIG. 3 with a first layer of polysilicon and a second layer of polysilicon deposited thereon and etched according to a storage node pattern.

Referring to FIG. 4, the wafer may be exposed to a polysilicon-2 piranha cleaning step as well aa a polysilicon-2 HF cleaning step. The purpose of the two cleaning steps is to remove any remaining photoresist, any organics, as well as to remove native oxides from the surface of the wafer. Thereafter, an insitu doped layer of polysilicon 82 is deposited on top of the wafer to contact and cover operatively exposed first active region 68. Polysilicon layer 82 is preferably an insitu, lightly doped layer. Layer 82 is of a relatively high resistivity on the order of 100–1000 Ω/square. The thickness of the layer 82 is approximately 600–1200 Angstroms. The layer 82 is deposited in a manner that defines upper portions 86 positioned on top of word lines 56, 58 and a lower portion 88 positioned on top of region 76.

Thereafter, the wafer may be subjected to another HF cleaning step. After the cleaning step, an HSG polysilicon-2 layer 84 is deposited on top of the first layer 82. The second layer 84 may be a rugged layer of polysilicon as disclosed in U.S. Pat. No. 5,037,773 entitled Stacked Capacitor Doping Technique Making Use Of Rugged Polysilicon, which is hereby incorporated by reference. The second layer 84 is an undoped layer approximately 600 Angstroms thick. The second layer is deposited in a manner that defines an upper portion 86I on top of upper portion 86 and a lower portion 88' on top of lower portion 88. Thereafter, the layers 82 and 84 are etched according to a predetermined pattern, in the present case a storage node polysilicon pattern, which results in the structure illustrated in FIG. 4. The etch may be a dry etch, and the photoresist may be removed with an ash/piranha two-step process. Thereafter, the wafer may be subjected to another piranha cleaning step.

Figure 5:
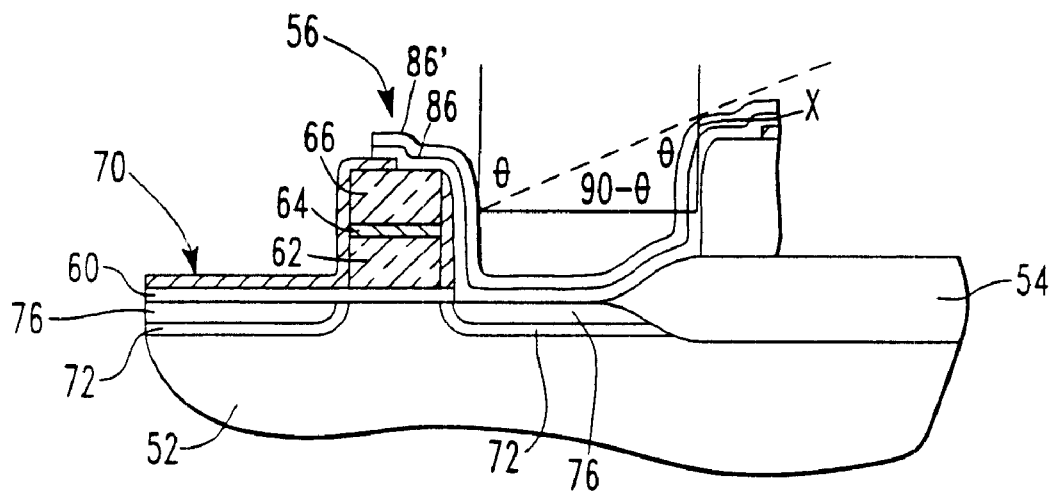
FIG. 5 illustrates the second polysilicon layer being subjected to a angled ion implant.

FIG. 5, which is not drawn to scale, illustrates the second polysilicon layer 84 being subjected to an angled ion implant. In the figure, from the top of the upper portion 86' to the top of the lower portion 88' is approximately 1.1 microns. The width of the generally U-shaped opening formed by the lower portion 88 separating upper portions 86 is approximately 0.3 microns. The angle of incidence θ can be determined by assuming a value for X in FIG. 5. If X is chosen to be 1.1 microns, such that the implant reaches the lower portion 88' of the second layer 84, then the angle of incidence is approximately 15°. Increasing the angle above 15° causes the dopant to be implanted further up the layer toward the upper portion 86'. By controlling the angle of incidence θ, a predetermined dopant density profile can be obtained in which the density of the dopant decreases from the upper portion 86' to the lower portion 88'. The angles and dimensions given herein are exemplary only such that different film geometries with different dimensions, will yield different angles of implementation.

It is likely that for the film geometry illustrated in FIG. 5, two angles of implantation, with the angle of implantation being relative to the wafer flat, of, for example, 90° and 270°, will be sufficient. For other types of geometries such as three dimensional circular structures, four-angle implants at, for example, 0°, 90°, 180°, and 270°, may be required to fully implant the geometry.

The dopant levels necessary are anticipated to be on the order of 1 to $5 \times 10^{15}$ atoms/cm$^2$ total dose. With such dopant levels, the layer 84 is of a relatively low resistivity, on the order of 80–400 Ω/square. To prevent capacitor depletion effects, it is expected that a medium current machine such as a Varian Model E500 may not be suitable because of its lower beam currents. A high current machine which runs batch wafers could be configured to run at the desired angles of incidence of between approximately seven to twenty-five degrees. The dose requirements for the present invention are somewhat less than for a zero degree implant wherein the process relies upon scattered ions to reach the sidewall of the storage node. Thus, the dosage levels anticipated with the angled implant of the present invention are lower than the dosage levels associated with zero degree implants.

Figure 6A:
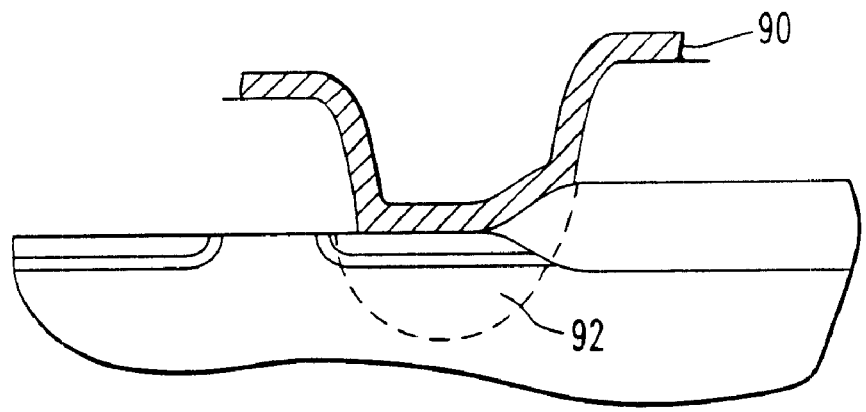
FIGS. 6a and 6b compare outdiffusion from a polysilicon layer of the prior art with the outdiffusion from the first and second polysilicon layers of the present invention, respectively.
Figure 6B:
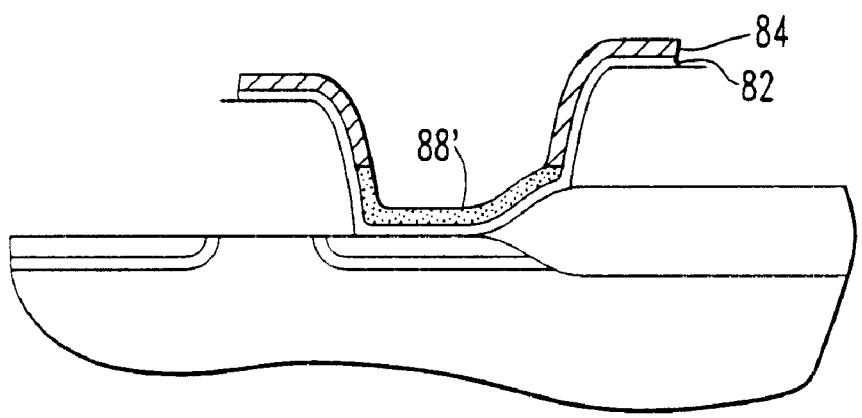

FIGS. 6*a* and 6*b* compare the outdiffusion from a polysilicon layer 90 of the prior art with the outdiffusion from the first 82 and second 84 polysilicon layers of the present invention, respectively. The prior art uses a single polysilicon layer 90 as the storage node poly, as shown in FIG. 6*a*, which is doped after the polysilicon has been deposited. The post deposition period requires a high temperature that drives the dopant into the layer 90 and oxidizes the top of the layer as well, which slightly thins the layer 90. The higher temperature drives the dopant not only into the layer 90 but also through the layer 90 into the silicon substrate below as identified by the numeral 92 in FIG. 6*a*. Because the doping step requires that the polysilicon layer 90 be heavily doped to reduce its resistivity so that there are no depletion effects at the capacitor interface, the extra dopant, due to poor control of the doping concentration, leads to excessive outdiffusion into the substrate.

In contrast, the two layer method of the present invention improves the outdiffusion characteristics by performing a slight, insitu phosphorous doping of the first layer 82. The second layer 84 is deposited at about 500° C. to 530° C. such that very little outdiffusion occurs during the deposition phase. The second layer is then implanted with a heavy dose at an angle to tailor the doping concentration from the upper portion 86' to the lower portion 88'. The subsequent heat steps will first drive the dopant into layer 84. The dopant will then be driven from the hatched region as shown in FIG. 6*b* to the dotted region. The net effect will be that the doping of the lower portion 88 of the polysilicon layer 82 is no greater than the doping in the initial insitu layer 82. That means that there will be a minimal amount of controlled diffusion into the storage node diode n-plate. Use of the two layers 82 and 84 in place of the single prior art layer 90, together with the angled implant thus keeps the dopant from the bottom of the storage node.

The outdiffusion found in the prior art effects the diode junction profile such that charge leakage is greater and the threshold voltage on the access transistor is lowered. The present invention, by eliminating the outdiffusion region 92 found in the prior art, results in better control over the threshold voltage of the access transistor, longer periods before static refresh is required, and better results with respect to soft errors. Those advantages, coupled with lower dosages, are believed to offset the somewhat longer processing time required by a two-angle or a four-angle implant.

Figure 7:
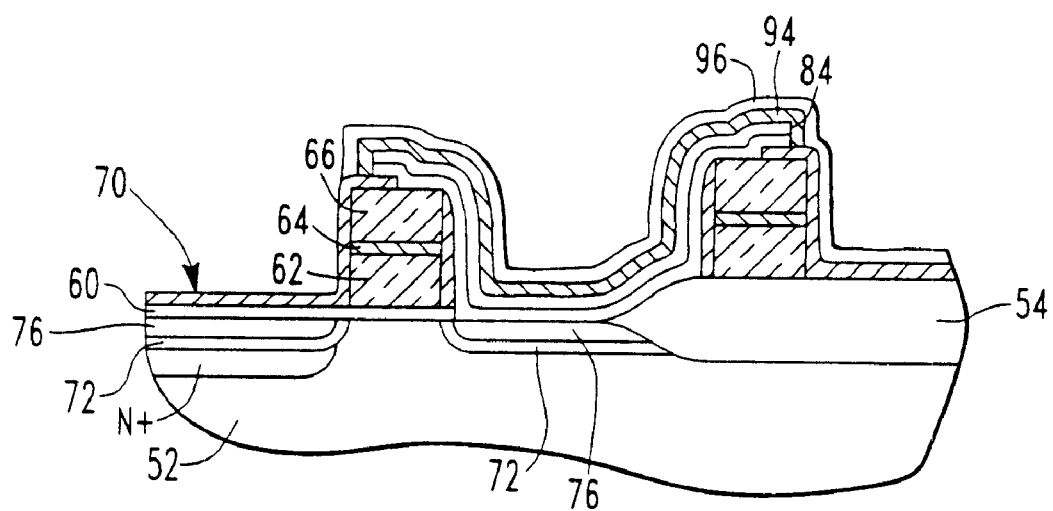
FIG. 7 illustrates the wafer of FIGS. 1–3 with the fabrication of the capacitor completed.

Returning to FIG. 4, once the second polysilicon layer 84 has been appropriately doped, the circuit may be completed using prior art fabrication techniques. For example, the circuit may be completed using the techniques found in U.S. Pat. No. 5,198,386 entitled Method Of Making Stacked Capacitors For DRAM Cell, which is hereby incorporated by reference. For example, with reference to FIG. 7, a layer 94 of capacitor dielectric material is provided on top of the second polysilicon layer 84. A subsequent layer 96 of polysilicon is provided on top of dielectric layer 94 to provide the upper plate, or cell plate, of the capacitor. After the dielectric layer 94 and layer of cell polysilicon 96 are patterned, the resulting capacitor is illustrated in FIG. 7.

While the present invention has been described in conjunction with a preferred embodiment thereof, those of ordinary skill in the art will recognize that many modifications of the present invention may be implemented. The foregoing description and the following claims are intended to cover all such modifications and variations.

What is claimed is:

1. A method of fabricating a three-dimensional layer forming a part of a component so as to reduce the amount of outdiffusion from the layer during fabrication, said method comprising:

forming a three-dimensional layer on a substrate from a lightly and uniformly doped first film and a second film on top of the first film, said first and second films having upper horizontal portions and lower horizontal portions interconnected by vertical portions, the second film having portions of high dopant concentrations and low dopant concentrations formed by doping using an angled implant as measured from said upper portions to said lower portions, respectively, and as measured through said second film; and driving the dopant from the portions of high dopant concentrations in the second film to the portions of low dopant concentrations in the second film such that the dopant concentrations of the first film adjacent to the lower portions of the second film do not increase during the driving step.

2. The method of claim 1 wherein the step of forming the three-dimensional film includes the steps of:

depositing the first film using an insitu doping technique;

depositing an undoped second film on top of the first film; and doping the second film so as to have said portions having high dopant concentrations and low dopant concentrations.

3. The method of claim 1 wherein the first film is approximately 600–1200 Angstroms thick and the second film is approximately 600 Angstroms thick.

4. The method of claim 1 wherein the first film has a resistivity of approximately 100–1000Ω/square and the second film has a resistivity of approximately 80–400Ω/square.

5. The method of claim 1 wherein the step of doping using an angled implant includes the step of doping at an angle of incidence of between approximately seven to twenty-five degrees.

6. The-method of claim 1 wherein the step of doping the second film includes the step of doping using a multi-angled implant.

7. A method of forming a conductive element of a circuit device, comprising:

providing a first layer of said conductive element of said circuit device;

providing a second layer on said first layer, wherein said second layer defines a first, substantially horizontal portion, and a second, substantially vertical portion;

creating a dopant gradient by angled implantation between said first and second portions of said second layer; and reducing said dopant gradient between said first and second portions of said second layer by driving dopant through said vertical portion to said horizontal portion.

8. The method of claim 7 wherein said step of creating includes creating a gradient in which said second portion has a higher initial dopant concentration than said first portion.

9. The method of claim 7 wherein said step of creating includes creating a gradient using a two-angled implant.

10. A method of forming an electrode, comprising:

providing a first electrode layer at a transistor contact area;

providing a second electrode layer over said first electrode layer, wherein said second electrode layer comprises a first horizontal lower portion adjacent said transistor contact area and a second horizontal upper portion remote from said transistor contact area and connected to said first portion by a vertical portion;

implanting a dopant to said second portion of said second electrode layer by angled implantation to form a dopant gradient as measured from said second portion to said first portion and as measured through said second layer; and causing said dopant to move to said first portion from said second portion of said second electrode layer.

11. The method of claim 10 wherein said first electrode layer has an initial dopant concentration, and wherein after said causing step, the dopant concentration of said first electrode layer of the transistor contact area is no greater than the initial dopant concentration of said first electrode layer.

12. The method of claim 10 wherein said step of implanting a dopant includes the step of blocking said dopant from reaching said first portion of said second layer.

13. A method of forming a capacitor plate in a DRAM, comprising:

providing a first capacitor plate layer comprising a first lower horizontal region contacting a transistor active area;

providing an initially undoped second capacitor plate layer over said first capacitor plate layer, said second capacitor plate layer comprising a second lower horizontal region contacting said first region;

placing a dopant in said second capacitor plate layer by angled implantation to form a dopant density profile within said second capacitor plate layer defining a decrease in dopant density along said second layer toward said second region and as measured through said second capacitor plate; and altering said dopant density profile within said second capacitor plate layer by shifting dopant along said second layer toward said second region.

14. The method of claim 13 wherein said step of providing a first capacitor plate layer includes the step of providing a first capacitor plate layer that is lightly doped.

15. The step of claim 14 wherein said lightly doped first capacitor plate layer is substantially uniformly doped.

16. A method of processing semiconductor layers, comprising:

providing a first semiconductor layer having a first dopant density;

providing a second semiconductor layer on said first semiconductor layer, wherein said second semiconductor layer has an initial constant dopant density less than said first dopant density and wherein said second layer has an upper horizontal portion and a lower horizontal portion interconnected by a vertical portion;

generating a dopant density using angled implantation within said second semiconductor layer varying from said upper portion to said lower portion and varying through said layer, and wherein said dopant density at said lower portion of said second semiconductor layer is less than said first dopant density; and generating a final dopant density within said second semiconductor layer by shifting dopant along said second semiconductor layer towards lower portion.

17. The method of claim 16 wherein said step of providing a second semiconductor layer having an initial constant dopant density includes the step of providing a second semiconductor layer having a dopant density of zero dopants/unit$^3$.

* * * * *

UNITED STATES PATENT AND TRADEMARK OFFICE
CERTIFICATE OF CORRECTION

PATENT NO.   : 6,440,825 B1  Page 1 of 1
DATED        : August 27, 2002
INVENTOR(S)  : Gonzalez et al.

It is certified that error appears in the above-identified patent and that said Letters Patent is hereby corrected as shown below:

<u>Column 4,</u>
Line 18, delete "aa" and insert in its place -- as --
Line 41, delete "861" and insert in its place -- 86´ --

Signed and Sealed this

Twenty-third Day of September, 2003

JAMES E. ROGAN
*Director of the United States Patent and Trademark Office*